United States Patent
Colborn et al.

(10) Patent No.: US 7,339,785 B2
(45) Date of Patent: Mar. 4, 2008

(54) INTERPOSER FOR BLADE CENTER

(75) Inventors: Clifton P. Colborn, Rochester, MN (US); Candice L. Coletrane, Durham, NC (US); William G. Pagan, Durham, NC (US); Robyn A. McGlotten, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 11/385,378

(22) Filed: Mar. 21, 2006

(65) Prior Publication Data
US 2007/0223188 A1    Sep. 27, 2007

(51) Int. Cl.
*G06F 1/16*    (2006.01)

(52) U.S. Cl. .................. 361/685; 703/300; 710/302; 370/422

(58) Field of Classification Search .......... 703/23, 703/300; 710/302; 707/104.1; 439/685; 370/420, 422; 709/229, 203; 361/679–687, 361/724–727
See application file for complete search history.

(56) References Cited

U.S. PATENT DOCUMENTS

| | | |
|---|---|---|
| 5,930,496 A | 7/1999 | MacLaren et al. |
| 6,249,428 B1 * | 6/2001 | Jeffries et al. .............. 361/684 |
| 6,661,671 B1 | 12/2003 | Franke et al. |
| 2003/0105904 A1 | 6/2003 | Abbondanzio et al. |
| 2004/0062002 A1 * | 4/2004 | Barringer et al. ........... 361/687 |
| 2006/0256534 A1 * | 11/2006 | Garnett et al. .............. 361/730 |

\* cited by examiner

*Primary Examiner*—Hung Van Duong
(74) *Attorney, Agent, or Firm*—Cynthia S. Byrd, Esq.; Steven M. Greenberg, Esq.; Carey Rodriguez Greenberg & Paul LLP

(57) ABSTRACT

A computer system for receiving standard and expanded computer devices includes a chassis, a midplane, and an interposer. The chassis includes bays, each adapted to receive the standard computer device. The midplane includes connectors respectively aligned with the plurality of bays that connect the midplane to a standard computer device disposed within a bay. The standard and expanded computer devices are passed through the interposer, which includes a body defining slots respectively aligned with the bays. Each slot is sized to enable the standard computer device to pass through the slot. The slots includes first and second sets of adjacent slots. The interposer is configured to allow the expanded computer device to simultaneously pass through all slots of the first set of adjacent slots and prevent the expanded computer device, while positioned within the second set of adjacent slots, from fixedly engaging the chassis.

19 Claims, 6 Drawing Sheets

INTERPOSER FOR BLADE CENTER

BACKGROUND OF THE INVENTION

1. Field of the Invention

The disclosure relates generally to computer systems and, more specifically, to a computer system and device for preventing a computing device from being inserted into a particular bay within the computer system.

2. Description of the Related Art

FIG. 1 illustrates a system 200, commonly referred to as a blade center, for packaging a computer system. The computer system may include multiple computer devices, such as blade servers 202, a first (top) set of devices 204, a second (bottom) set of devices 206, and a midplane 270. In addition, the computer system may include blowers 207 and 209. The system 200 includes a main chassis 250 and a SPC chassis 260. The main chassis 250 includes a first cavity 210 and a second cavity 212. The first cavity 210 is configured to receive a peripheral device 208, and the cavity 210 includes bays adapted to receive a standard blade servers 202. Additionally, the main chassis 250 may be configured such that each of the blade servers 202 is hot pluggable into the first cavity 210. The midplane 270 may be a printed circuit board to which the blade servers 202 and devices 204 and 206 are separately connected via connectors 280.

FIGS. 2A and 2B respectively illustrate a conventional midplane 270 and blade server 202. Typically, two pairs of redundant power modules (not shown) are included that convert power from a single-phase (three-wire) external ac input source to +12 V for distribution to the system 200 via power connectors 230A, 230B and 232A, 232B on the midplane 270. Each of the redundant pairs of power modules powers an independent power domain. The power connectors 230A, 230B support power domain A, which includes blades 202 (1 through 6) and the chassis infrastructure, such as management modules, switch modules, blowers, front and rear operator panels, and a media tray. The power connectors 232A, 232B support power domain B, which includes blades 202 (7 through 14). If a single power module fails, the power domain will continue to supply power from the remaining power module.

The blade server 202 includes levers 260 that are attached to tabs 262 on the top and bottom of the blade server 202. After the blade server 202 is fully inserted into the chassis 250, the levers 260 are engaged, which drawings the tabs 262 out of the blade server 202 and into slots 264 on the top and bottom of the chassis 250. In this manner, the blade server 202 may be fixedly engaged to the chassis 250.

The midplane 270 includes connectors 280 that are respectively aligned with the plurality of bays in the main chassis 250. A typical blade server 202 includes a pair of plugs 258 that plug into connectors 280 on the midplane 270, certain blade servers (not shown) are double-wide in that the blade server fits into a pair of bays in the main chassis 250, and thus, use an additional set of connectors 280. For example, a SCSI storage expansion unit may be combined and interconnected with a normal blade server 202. In so doing the blade server 202 includes a pair of plugs 258 that plug into the connectors 280 on the midplane 270 and the expansion unit may also include additional plugs that plug into the connectors 280 of midplane 270.

An issue arises if this expanded blade server in installed into bays 6 and 7, which are within separate power domains. If power completely fails on one power domain, this lack of power will only shut down one portion of the expanded blade server (e.g., either the blade or the expansion unit). Since the blade and expansion unit are interconnected, loss of power to only one of these units could causes a malfunction in the computer system. There is, therefore, a need for a system and device for preventing a expanded blade server from being inserted into a particular set of adjacent bays within the computer system.

BRIEF SUMMARY OF THE INVENTION

Embodiments of the invention address deficiencies of the art in respect to computer systems and provide a novel and non-obvious system and device for preventing the insertion of an expanded computing device, which has a width greater than a width of a standard computer device, into a particular set of adjacent bays within a computer system. The computer system includes a chassis, a midplane, and an interposer. The chassis includes a plurality of bays with each bay adapted to receive the standard computer device. The bays have a width less than the width of the expanded computer device. The midplane includes a plurality of connectors respectively aligned with the plurality of bays, and each connector separately connects the midplane to a standard computer device disposed within a respective bay.

The standard computer device and the expanded computer device are passed through the interposer. The interposer includes a body defining a plurality of slots respectively aligned with the plurality of bays. Each slot is sized to enable the standard computer device to pass through the slot. The plurality of slots includes a first set of adjacent slots and a second set of adjacent slots. The interposer is configured to allow the expanded computer device to simultaneously pass through all slots of the first set of adjacent slots and prevent the expanded computer device, while positioned within the second set of adjacent slots, from fixedly engaging the chassis.

In certain aspects, the blocker system includes first and second tabs respectively disposed proximate first and second slots of the second set of adjacent slots, and simultaneous engagement of the first and second tabs disposes the blocker system in the first configuration. In certain aspects, the blocker system includes first and second slider tabs respectively connected to the first and second tabs, and the first and second slider tabs are configured to be jointly positioned over a slot in the chassis. In the first configuration, the first and second slider tabs inter-engage one another over the slot.

Another aspect of the blocker system includes a compressible resilient device disposed between and respectively connected to the first and second tabs via first and second end tabs. In the first configuration, rotation of the first and second tabs only partially withdraws the first and second end tabs from slots within the first and second tabs prior to the first and second tabs being prevented from rotating past a predetermine angle of rotation. Yet another aspect of the blocker system includes first and second inter-engaging gears respectively connected to the first and second tabs. In the first configuration, attempted simultaneous movement of the first and second tabs creates interfering rotation between the first and second gears.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
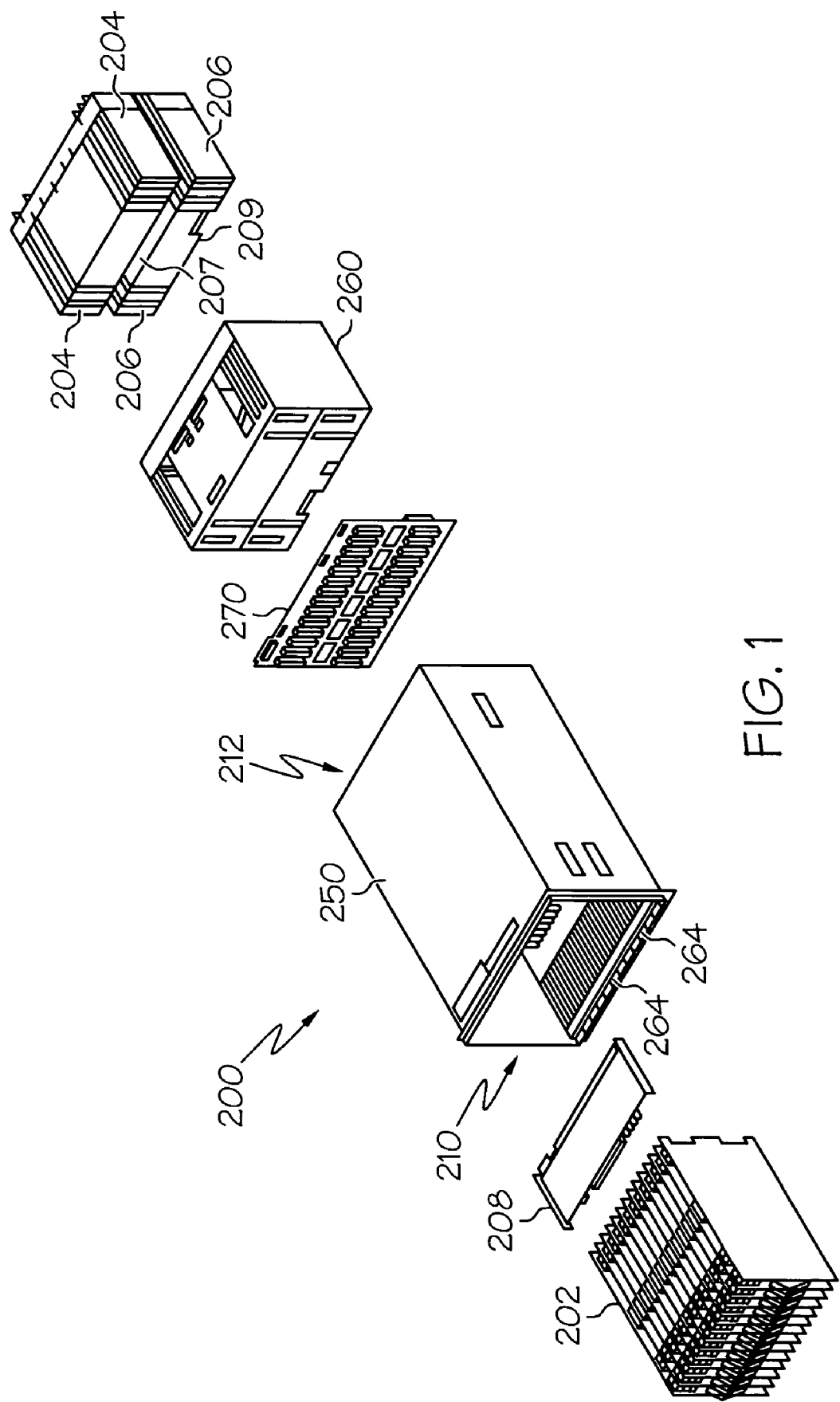
FIG. 1 is an exploded perspective view of a system for packaging a computer system in accordance with the inventive arrangements.
Figure 2A:
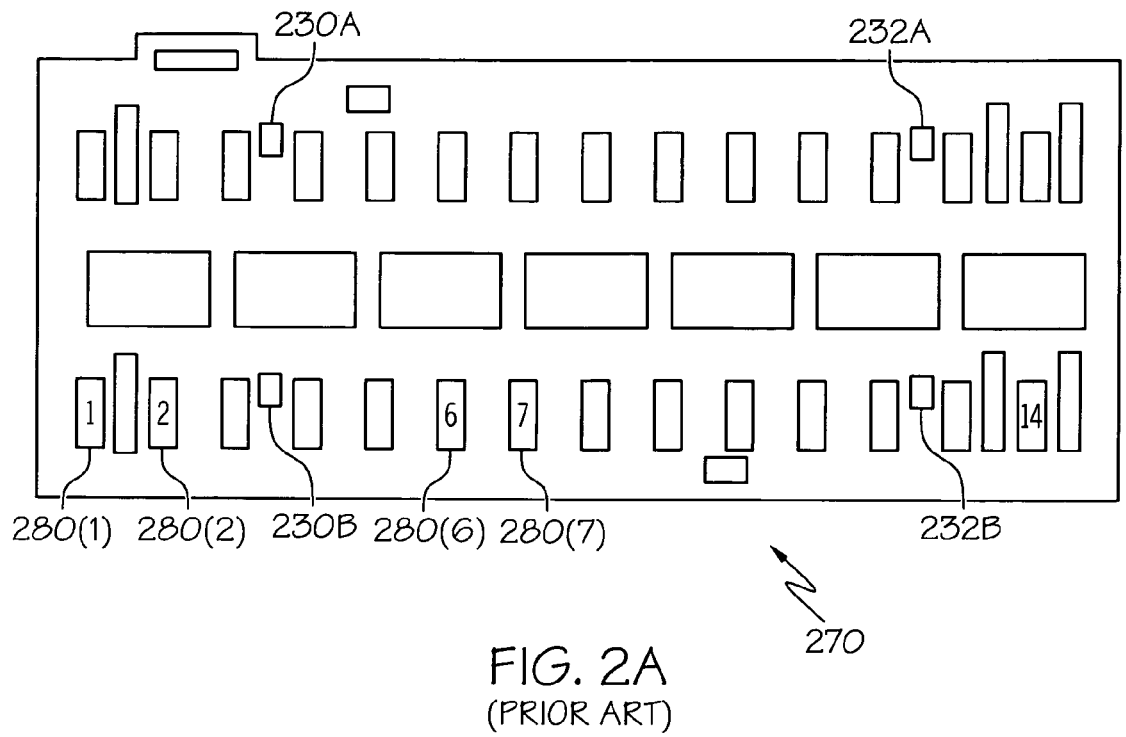
FIG. 2A is a front view of a conventional midplane.
Figure 2B:
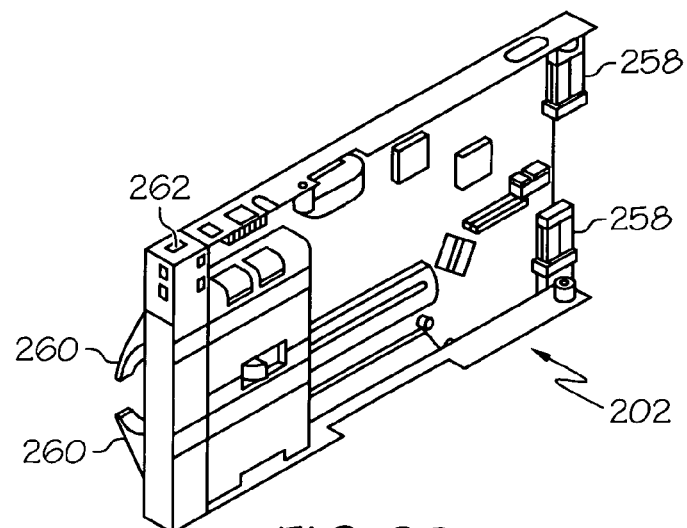
FIG. 2B is a perspective view of a conventional blade server.
Figure 3:
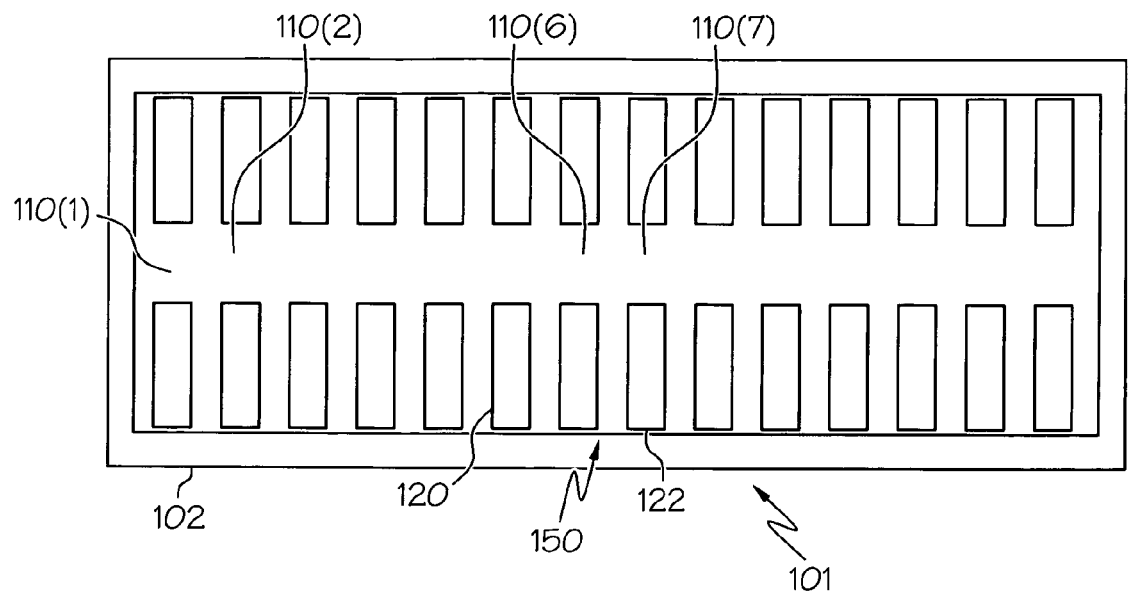
FIG. 3 is a front view of an interposer in accordance with the inventive arrangements.
Figure 4:
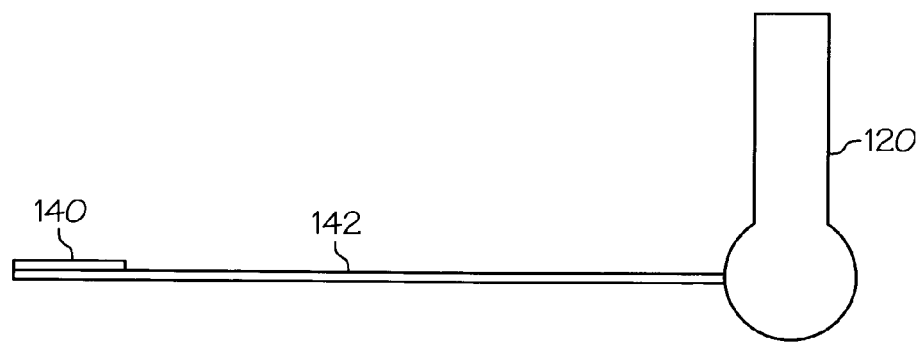
FIG. 4 is a side view of a mechanical blocker system for use with the interposer.

FIGS. 3A, 3B illustrate an interposer 100 that may be used with the system 200 for packaging the computer system illustrated in FIG. 1. Although not limited as to a particular location, the interposer 100 is positioned within the chassis 250 and in front of the midplane 270. The interposer 100 includes a body 102 defining a plurality of slots 110 that are respectively aligned with the plurality of bays in the main chassis 250. Each slot 110 is sized to enable a computer device 202 to pass through the slot 110. The slots 110 may be interconnected or separate.

The plurality of slots 110 includes at least one first set of adjacent slots $110_1$, $110_2$ and at least one second set of adjacent slots $110_6$, $110_7$. Although described as referring to two slots 110, the set of adjacent slots 110 can also refer to more than two adjacent slots 110. The first set of adjacent slots $110_1$, $110_2$ is configured to allow an expanded computer device (i.e., a computer device having a width greater than a width of a standard computer device or a bay), such as a SCSI storage expansion unit coupled with a normal blade server 202, to pass simultaneously through both slots $110_1$, $110_2$ of the first set of adjacent slots $110_1$, $110_2$. In this manner, the first set of adjacent slots $110_1$, $110_2$ is comparable to any set of conventional adjacent slots, which will allow an expanded computer device to be introduced into a set of adjacent bays within the main chassis 250.

The second set of adjacent slots $110_6$, $110_7$ is configured to prevent the expanded computer device from simultaneously passing through both slots $110_6$, $110_7$ of the second set of adjacent slots $110_6$, $110_7$ and/or fixedly engage the chassis 250 yet to allow the standard computer device 202 to pass through either one $110_6$ or $110_7$ of the second set of adjacent slots $110_6$, $110_7$. The interposer 100 is not limited in the manner in which the second set of adjacent slots $110_6$, $110_7$ is configured to prevent the expanded computer device from simultaneously passing through both slots $110_6$, $110_7$ of the second set of adjacent slots $110_6$, $110_7$. However, in certain aspects of the interposer 100, a blocker system 150 is connected to the second set of adjacent slots $110_6$, $110_7$.

In certain aspects of the system 200, the expanded computer device is configured to connect to both adjacent connectors 280 in the midplane 270 that are respectively aligned with both adjacent bays in the main chassis 250 into which the expanded computer device is received. Also, the first set of adjacent slots $110_1$, $110_2$ are respectively aligned with a first set of adjacent connectors $280_1$, $280_2$ of the midplane 270, and the first set of adjacent connectors $280_1$, $280_2$ may be within a single power domain. The second set of adjacent slots $110_6$, $110_7$ are respectively aligned with a second set of adjacent connectors $280_6$, $280_7$ of the midplane 270, and each of the second set of adjacent connectors $280_6$, $280_7$ are within separate power domains.

In this manner, the interposer 101 may allow the expanded computer device to fixedly engage the chassis 250 and/or be inserted only into adjacent slots (e.g., $110_1$, $110_2$) that are respectively aligned with adjacent connectors (e.g., $280_1$, $280_2$) within the same power domain. By preventing the expanded computer device from being inserted into the second set of adjacent slots $110_6$, $110_7$, issues arising from the expanded computer device having a power failure in a single power domain (i.e., one portion of the expanded computer device being powered and another portion of the expanded computer device not being powered) may be prevented.

Three different aspects of the blocker system 150 are respectively illustrated in FIGS. 4-7. The blocker system 150 has a first configuration and a second configuration. In the first configuration, the blocker system 150 prevents the expanded computer device from fixedly engaging the chassis 250 and/or simultaneously passing through both slots $110_6$, $110_7$ of the second set of adjacent slots $110_6$, $110_7$, and in the second configuration, the blocker system allows a standard computer device 202 to pass through either one $110_6$ or $110_7$ of the second set of adjacent slots $110_6$, $110_7$, and any blocker system 150 so capable is acceptable for use with the interposer 100. As apparent from the three illustrated aspects of the blocker system 150, many different types of blocker systems 150 are so capable, and the interposer 100 is not limited as to the blocker systems 150 illustrated in FIGS. 4-7.

FIGS. 4 and 5A-5C illustrate one type of blocker system $150_A$. The blocker system $150_A$ includes slider tabs $140_6$, $140_7$ respectively connected to the top and bottom tabs 120, 122 via linkages 142. In operation, as a single tab 120 or 122 is rotated (e.g., as a standard computer device 202 is passed through a slot 110), this rotation causes a respective slider tab 140 to be positioned over the slot 264 in the chassis 250 (i.e., FIG. 5C). The slider tab 140 may also include a hinge 144. In this manner, a tab 262 of the standard computer device 202 may be able move the slider tab 140 from the slot 264 and/or the slider tab 140 may fall within the slot 264. In either instance, the standard computer device 202 is able to fixedly engage the chassis 250.

Figure 5A:
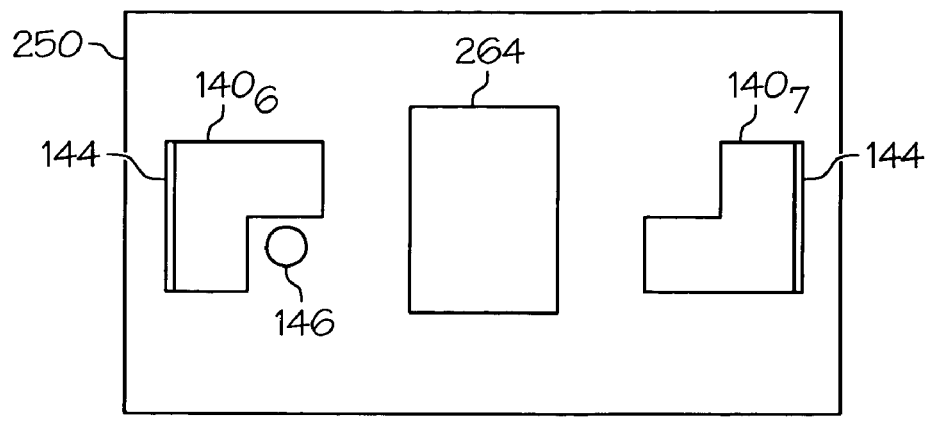
FIGS. 5A-5C are top views of the mechanical blocker system illustrated in FIG. 4 in conjunction with the chassis of the system for packaging the computer system.
Figure 5B:
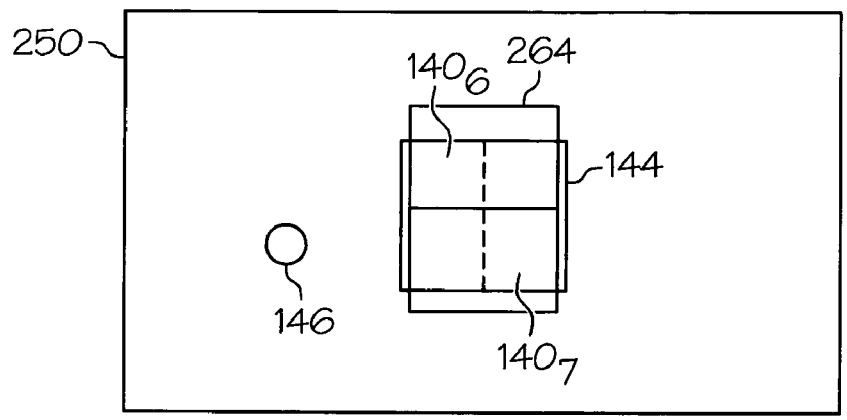
Figure 5C:
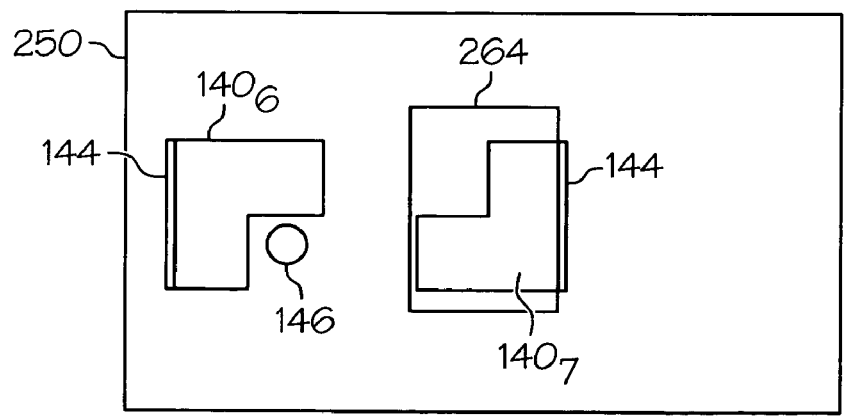

Referring to FIG. 5B, where both tabs 120, 122 are rotated simultaneously (e.g., when the expanded computer device is inserted into both slots $110_6$, $110_7$ of the second set of adjacent slots $110_6$, $110_7$), this rotation of both tabs 120, 122 causes both respective slider tabs $140_6$, $140_7$ to be positioned over the slot 264 and to inter-engage one another. The manner in which the slider tabs $140_6$, $140_7$ inter-engage one another is not limited so long as the slider tabs $140_6$, $140_7$ prevent the tab 262 of the expanded computer device from engaging the slot 265 and thus preventing the expanded computer device from fixedly engaging the chassis 250.

The blocker system $150_A$ may also include one or more pins 146 that move along with an oppositely disposed slider tab $140_7$. The pin 146 is moved by the tab 122 that moves the oppositely disposed slider tab $140_7$ but in a delayed manner. Since movement of the pin 146 is delayed, the pin 146 does not interfere with the movement of both slider tabs $140_6$, $140_7$ during the insertion of the expanded computer device. The pin 146, however, is capable of preventing a slider tabs $140_6$ from moving over the slot 265 after the oppositely disposed slider tab $140_7$ has moved. In this manner, separate standard computer devices 202 may be separately inserted into the second set of adjacent slots $110_6$, $110_7$ yet the slider tabs $140_6$, $140_7$ are prevented from inter-engaging one another thereby preventing at least one of the computer devices 202 from fixedly engaging the chassis 250.

Figure 6A:
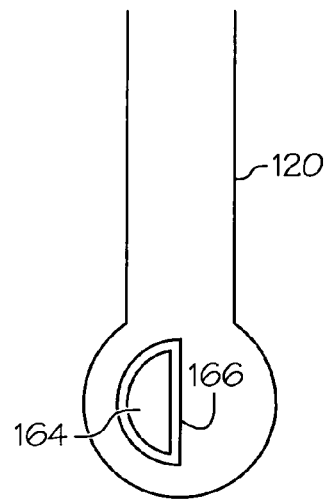
FIGS. 6A and 6B are respectively a partial side view and a perspective view of another mechanical blocker system for use with the interposer.
Figure 6B:
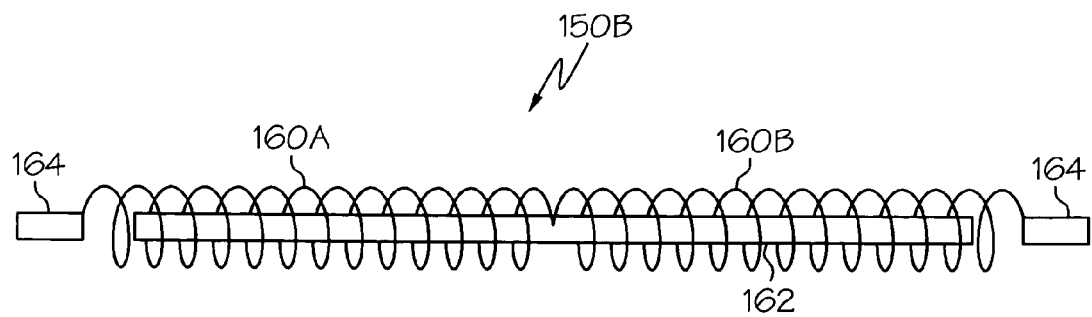

FIGS. 6A-6B illustrate yet another type of blocker system $150_B$. The blocker system $150_B$ includes a compressible resilient device $160_A$, $160_B$ disposed between and connected to the tabs 120, 122 of the second set of adjacent slots $110_6$, $110_7$ via end tabs 164. The blocker system $150_B$ may also include a shaft 162 to support the resilient device $160_A$, $160_B$. Although not limited in this manner, the compressible resilient device $160_A$, $160_B$ includes a pair of oppositely rotating springs that are connected at a central position.

In operation, each of the end tabs 164 are initially positioned within slots 166 disposed within each tabs 120, 122. As a single tab 120 or 122 is rotated (e.g., as a standard computer device 202 is passed through a slot 110), this rotation causes the resilient device $160_A$, $160_B$ to be compressed, which causes the end tab 164 to be withdrawn from the slot 166 within the tab 120 or 122. At a predetermined angle of rotation of the single tab 120 or 122, the resilient device $160_A$, $160_B$ is sufficiently compressed to withdraw the end tab 164 completely out of the slot 166 within the tab 120 or 122, and in this manner, the single tab 120 or 122 is allowed to rotate freely.

In a situation where both tabs 120, 122 are rotated simultaneously (e.g., when the expanded computer device is inserted into both slots $110_6$, $110_7$ of the second set of adjacent slots $110_6$, $110_7$), this rotation of both ends tabs 164 by both tabs 120, 122 causes the resilient device $160_A$, $160_B$ to be doubly compressed. However, the resilient device $160_A$, $160_B$ is configured to only allow a predetermined amount of compression. The predetermined amount of compression is enough to allow a single end tab 164 to be withdrawn from the slot 166 within the tab 120 or 122 when only a single tab 120 or 122 is being rotated. However, the predetermined amount of compression is not enough to allow both end tabs 164 to be withdrawn from both of the slots 166 of the tabs 120, 122 when both tabs 120, 122 are being rotated.

The tabs 120, 122 are also configured to stop rotating past a predetermined angle of rotation if the end tabs 164 are not withdrawn from the slots 166. In this manner, if both tabs 120, 122 are being rotated, the tabs 120, 122 are prevented from rotating past the predetermined angle of rotation, thereby preventing insertion of the expanded computer device, since the end tabs 164 cannot sufficiently compress the resilient device $160_A$, $160_B$. However, if a single tab 120 or 122 is being rotated, the end tab 164 is withdrawn from the slot 166 and the single tab 120 or 122 is allowed to rotate freely, which allows for insertion of the standard computer device 202.

Figure 7A:
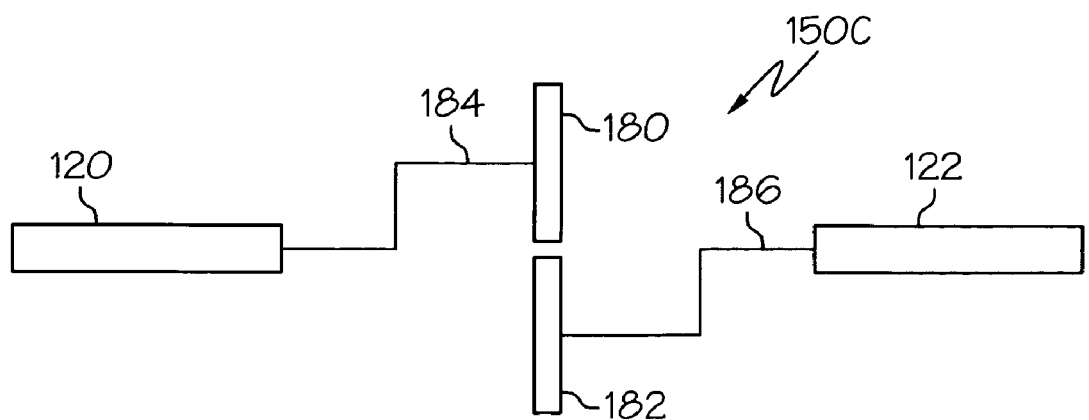
FIGS. 7A-7C are respectively a top view and partial side view of yet another mechanical blocker system for use with the interposer.
Figure 7B:
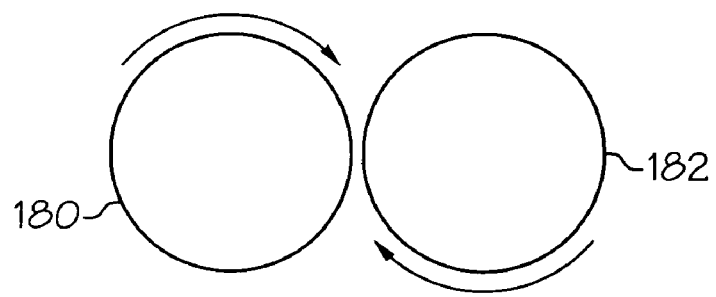
Figure 7C:
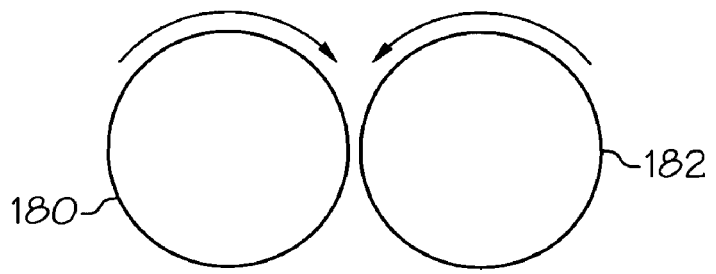

FIGS. 7A-7C illustrate yet another type of blocker system $150_C$. The blocker system $150_C$ includes a set of inter-engaging gears 180, 182 that are respectively connected to the tabs 120, 122 for the second set of adjacent slots $110_6$, $110_7$. Although the gears 180, 182 are not limited in the manner in which the gears 180, 182 are attached to the tabs 120, 122, in certain aspects of the blocker system $150_C$, respective linkages 184, 186 connect the gears 180, 182 to the tabs 120, 122.

The gears 180, 182 are configured such that simultaneous attempted movement of the tabs 120, 122 (e.g., when the expanded computer device is inserted into both slots $110_6$, $110_7$ of the second set of adjacent slots $110_6$, $110_7$) creates interfering rotation between the gears 180,182, which is illustrated, for example, in FIG. 7B. The rotation (shown by a clockwise arrow) of one gear 180 interferes with the rotation (shown by a clockwise arrow) of the other gears 182, and this interference prevents the tabs 120, 122 from moving, which prevents the expanded computer device from simultaneously passing through both slots $110_6$, $110_7$ of the second set of adjacent slots $110_6$, $110_7$.

Referring to FIG. 7C, as a single tab 120 or 122 is rotated (e.g., as a standard computer device 202 is passed through a slot 110), this rotation causes one of the gears 180 or 182 to rotate. Since the other tab 120 or 122 is free to rotate, the one gear 180 or 182 can cause the other gear 180 or 182 to rotate without interference. In this manner, the blocker system $150_C$ allows for insertion of a standard computer device 202.

What is claimed is:

1. An interposer through which a standard computer device and an expanded computer device are passed, the expanded computer device having a width greater than a width of the standard computer device, comprising:
    a body defining a plurality of slots, wherein
    each slot is sized to enable the standard computer device to pass through the slot,
    the plurality of slots includes first and second sets of adjacent slots, and
    the interposer configured to allow the expanded computer device to simultaneously pass through all slots of the first set of adjacent slots and prevent the expanded computer device, while positioned within the second set of adjacent slots, from fixedly engaging a chassis in which the interposer is disposed.

2. The interposer of claim 1, further comprising a blocker system connected to the second set of adjacent slots, the blocker system having a first configuration and a second configuration, wherein
    in the first configuration, the blocker system preventing the expanded computer device from simultaneously passing through all slots of the second set of adjacent slots, and
    in the second configuration, the blocker system allowing a standard computer device to pass through any of the second set of adjacent slots.

3. The interposer of claim 2, wherein
    the blocker system includes first and second tabs respectively disposed proximate first and second slots of the second set of adjacent slots, and
    simultaneous engagement of the first and second tabs disposes the blocker system in the first configuration.

4. The interposer of claim 3, wherein the blocker system includes first and second slider tabs respectively connected to the first and second tabs and configured to jointly cover a slot in the chassis.

5. The interposer of claim 4, wherein in the first configuration, the first and second slider tabs inter-engage one another while covering the slot.

6. The interposer of claim 3, wherein the blocker system includes a compressible resilient device disposed between and respectively connected to the first and second tabs via first and second end tabs.

7. The interposer of claim 6, wherein in the first configuration, rotation of the first and second tabs only partially withdraws the first and second end tabs from slots within the first and second tabs prior to the first and second tabs prevented from rotating past a predetermine angle of rotation.

8. The interposer of claim 3, wherein the blocker system includes first and second inter-engaging gears respectively connected to the first and second tabs.

9. The interposer of claim 8, wherein in the first configuration, attempted simultaneous movement of the first and second tabs creates interfering rotation between the first and second gears.

10. A computer system for receiving a standard computer device and an expanded computer device having a width greater than a width of the standard computer device, comprising:
   a chassis including a plurality of bays, each bay adapted to receive the standard computer device and having a width less than the width of the expanded computer device,
   a midplane including a plurality of connectors respectively aligned with the plurality of bays, each connector separately connectable to a standard computer device disposed within a respective bay;
   an interposer through which the standard computer device and the expanded computer device is passed, the interposer including
      a body defining a plurality of slots respectively aligned with the plurality of bays, wherein
      each slot is sized to enable the standard computer device to pass through the slot,
      the plurality of slots includes first and second sets of adjacent slots, and
      the interposer configured to allow the expanded computer device to simultaneously pass through all slots of the first set of adjacent slots and prevent the expanded computer device, while positioned within the second set of adjacent slots, from fixedly engaging the chassis.

11. The computer system according to claim 10, wherein
   the first set of adjacent slots respectively aligned with a first set of adjacent connectors of the midplane, the first set of adjacent connectors positioned within a single domain, and
   the second set of adjacent slots respectively aligned with a second set of adjacent connectors of the midplane, the second set of adjacent connectors including connectors within separate domains.

12. The computer system of claim 10, wherein
   the interposer further includes a blocker system connected to the second set of adjacent slots, the blocker system having a first configuration and a second configuration,
   in the first configuration, the blocker system preventing the expanded computer device from simultaneously passing through all slots of the second set of adjacent slots, and
   in the second configuration, the blocker system allowing a standard computer device to pass through any of the second set of adjacent slots.

13. The computer system of claim 12, wherein
   the blocker system includes first and second tabs respectively disposed proximate first and second slots of the second set of adjacent slots, and
   simultaneous engagement of the first and second tabs disposes the blocker system in the first configuration.

14. The computer system of claim 13, wherein the blocker system includes first and second slider tabs respectively connected to the first and second tabs and configured to jointly cover a slot in the chassis.

15. The computer system of claim 14, wherein in the first configuration, the first and second slider tabs inter-engage one another while covering the slot.

16. The computer system of claim 13, wherein the blocker system includes a compressible resilient device disposed between and respectively connected to the first and second tabs via first and second end tabs.

17. The computer system of claim 16, wherein in the first configuration, rotation of the first and second tabs only partially withdraws the first and second end tabs from slots within the first and second tabs prior to the first and second tabs prevented from rotating past a predetermine angle of rotation.

18. The computer system of claim 13, wherein the blocker system includes first and second inter-engaging gears respectively connected to the first and second tabs.

19. The computer system of claim 12, wherein in the first configuration, attempted simultaneous movement of the first and second tabs creates interfering rotation between the first and second gears.

* * * * *